(12) United States Patent
Adams et al.

(10) Patent No.: US 6,668,912 B2
(45) Date of Patent: Dec. 30, 2003

(54) HEAT EXCHANGER CAST IN METAL MATRIX COMPOSITE AND METHOD OF MAKING THE SAME

(75) Inventors: Richard Adams, Marlboro, MA (US); Kevin Fennessy, New Bedford, MA (US); Mark Occhionero, Milford, MA (US); Mark Rossi, Warwick, RI (US)

(73) Assignee: Ceramic Process Systems, Inc., Chartley, MA (US)

( * ) Notice: Subject to any disclaimer, the term of this patent is extended or adjusted under 35 U.S.C. 154(b) by 0 days.

(21) Appl. No.: 10/222,619

(22) Filed: Aug. 16, 2002

(65) Prior Publication Data

US 2003/0024120 A1 Feb. 6, 2003

Related U.S. Application Data

(62) Division of application No. 09/721,724, filed on Nov. 27, 2000, now Pat. No. 6,460,598.

(51) Int. Cl.⁷ .................................................. F28F 7/00
(52) U.S. Cl. ...................... 165/80.4; 165/185; 164/98
(58) Field of Search ................................. 165/185, 905; 164/132, 97, 98

(56) References Cited

U.S. PATENT DOCUMENTS

| | | | | |
|---|---|---|---|---|
| 4,677,724 A | * | 7/1987 | Kuroki ................... 29/157.3 R |
| 5,255,729 A | * | 10/1993 | Cook ............................ 165/97 |
| 5,371,043 A | * | 12/1994 | Anderson et al. ............ 437/209 |
| 5,662,157 A | * | 9/1997 | Cook ............................ 164/97 |
| 5,875,830 A | * | 3/1999 | Singer et al. .................. 164/98 |
| 6,134,785 A | * | 10/2000 | Walter et al. ........... 29/890.054 |
| 6,257,310 B1 | * | 7/2001 | Janko ............................ 164/98 |

* cited by examiner

Primary Examiner—Terrell McKinnon

(57) ABSTRACT

The specification and drawings describe and show an embodiment of and method of forming a liquid flow through heat exchanger structure cast in a metal matrix composite. The composite comprises a preform reinforcement material infiltrated with molten metal. The composite reinforcement material is injection molded around the heat exchanger structure allowing for intimate contact between the composite and structure. The composite formed has a specific coefficient of thermal expansion to match an active heat-generating device mounted thereon. The present invention allows for enhanced thermal and mechanical properties by eliminating voids or gaps at the composite to heat exchanger structure interface, these voids or gaps being present in prior art fabrication methods or induced by usage due to thermal cycling of prior art composites. It is emphasized that this abstract is provided to comply with the rules requiring an abstract, which will allow a searcher or other reader to quickly ascertain the subject matter of the technical disclosure. It is submitted with the understanding that it will not be used to interpret or limit the scope or meaning of the claims. 37 CFR 1.72(b).

9 Claims, 4 Drawing Sheets

US 6,668,912 B2

HEAT EXCHANGER CAST IN METAL MATRIX COMPOSITE AND METHOD OF MAKING THE SAME

This application is a divisional of application Ser. No. 09/721,724 filed Nov. 27 2000, now U.S. Pat. No. 6,460,598.

FIELD OF THE INVENTION

This invention relates generally to the dissipation of heat from high power electronic devices, and more particularly to the casting of an improved heat exchanger structure within a metal matrix composite.

BACKGROUND OF THE INVENTION

Heat dissipating plate and shell structures having desirable combinations of thermal conductivity, thermal expansion, and stiffness are in great demand for critical electronic applications. The heat generated in electronic components requires, in many cases, that heat sinks be used to remove the heat from the electronic device or component. Enhanced component reliability is achieved through use of heat sinks with good thermal conductivity to transfer heat away from high-density electronic components and devices such as integrated circuits. When heat sinks are not used, various other devices have been designed for direct attachment to a heat dissipating plate which, in turn, will act as a heat transfer element.

Moreover, the rapidly increasing density of integrated circuits, large-scale integrated circuits, power diodes and the like continues to create the need for improved thermal management solutions. Consequently, heat-dissipating structures have undergone continuous improvements as the electronics industry has developed. In these situations, it is often desirable to form internal cooling channels within a heat dissipating structure. Circulating fluids can then be used to more effectively remove heat from the heat-generating device mounted to the structure. This would allow for enhanced cooling efficiency and thermal stability in situations where the thermal conductivity of the heat dissipating structure alone is insufficient.

When the electronic components are attached to a heat dissipating structure, even one of the more advanced structures available today to provide good thermal conductivity, the different coefficients of thermal expansion for the various elements often cause problems. For example, the heat sink and the electrically insulating substrate, to which the electronic component is attached, may have different coefficients of thermal expansion. Similarly, different coefficients of thermal expansion may exist between the electronic component and the heat sink. When there is significant difference in coefficients of thermal expansion between components, temperature changes arising from soldering during assembly and heat generated in the systems during operation can cause large thermal stresses due to the differences in relative expansion of the materials. Such stresses may cause, in turn, premature component failure. Traditional thermal dissipation materials such as Al and Cu have CTE values that are much greater than IC devices or substrate materials. Therefore, the IC package typically includes a marginally compatible CTE interface, such as a high thermal resistivity $Al_2O_3$ substrate, to provide a stress-reducing interface. The solution presents a thermal penalty and often a reliability penalty in the form of cracked $Al_2O_3$ substrates. Traditional CTE-compatible packaging materials, such as Kovar and various other Ni—Fe alloys, have low thermal conductivity. More advanced packaging materials such as CuMo and CuW offer high thermal conductivity and compatible CTE values but are heavy and costly to fabricate in all but simple flat plate shapes. Aluminum Silicon Carbide (AlSiC) packages offer desirable packaging attributes of compatible CTE value and high thermal conductivity. An AlSiC heat dissipating structure is lightweight making it desirable for portable devices and airborne, spaceborne or any other weight sensitive application.

SUMMARY OF THE INVENTION

The present invention pertains to a fluid flow heat exchanger cast in a metal matrix composite and method of making the same. The method comprises the steps of 1.) positioning an insert within a mold chamber of a closed mold 2.) filling the closed mold with a preform reinforcement material such that the insert is completely encased or "overmolded" within the preform material, and 3.) infiltrating the preform and insert with a liquid metal and allowing for the metal to solidify to form a metal matrix composite. The process of filling the closed mold containing the insert with preform reinforcement material allows for intimate contact between the insert and the reinforcement material. Enhanced thermal and mechanical properties are realized by eliminating voids or gaps at this reinforcement material-to-tube interface. In one embodiment, the insert comprises a stainless steel hollow core closed at both ends. After the metal infiltration process is complete the closed ends of the tubes are opened to allow for liquid fluid flow through the metal matrix composite. In one embodiment, the metal matrix composite encasing the insert is comprised of an Aluminum Silicon Carbide (AlSiC) housing offering a unique set of material properties that are suited to high performance advanced thermal management packaging designs. AlSiC is a composite material of Al-metal and SiC particulate. Thermal conductivity values for Al/SiC materials are similar to Al metal and the AlSiC CTE values are compatible with direct device attachment. Furthermore, AlSiC CTE can be designed to fit the requirements of the specific application. Changing of the Al/SiC ratio and/or the Al-metal composition can modify the CTE to be compatible with the CTE of the heat-generating device mounted thereon.

BRIEF DESCRIPTION OF THE DRAWINGS

The invention is best understood from the following detailed description when read in connection with the accompanying drawings, which illustrate an embodiment of the present invention.

DETAILED DESCRIPTION OF THE INVENTION

Figure 1:
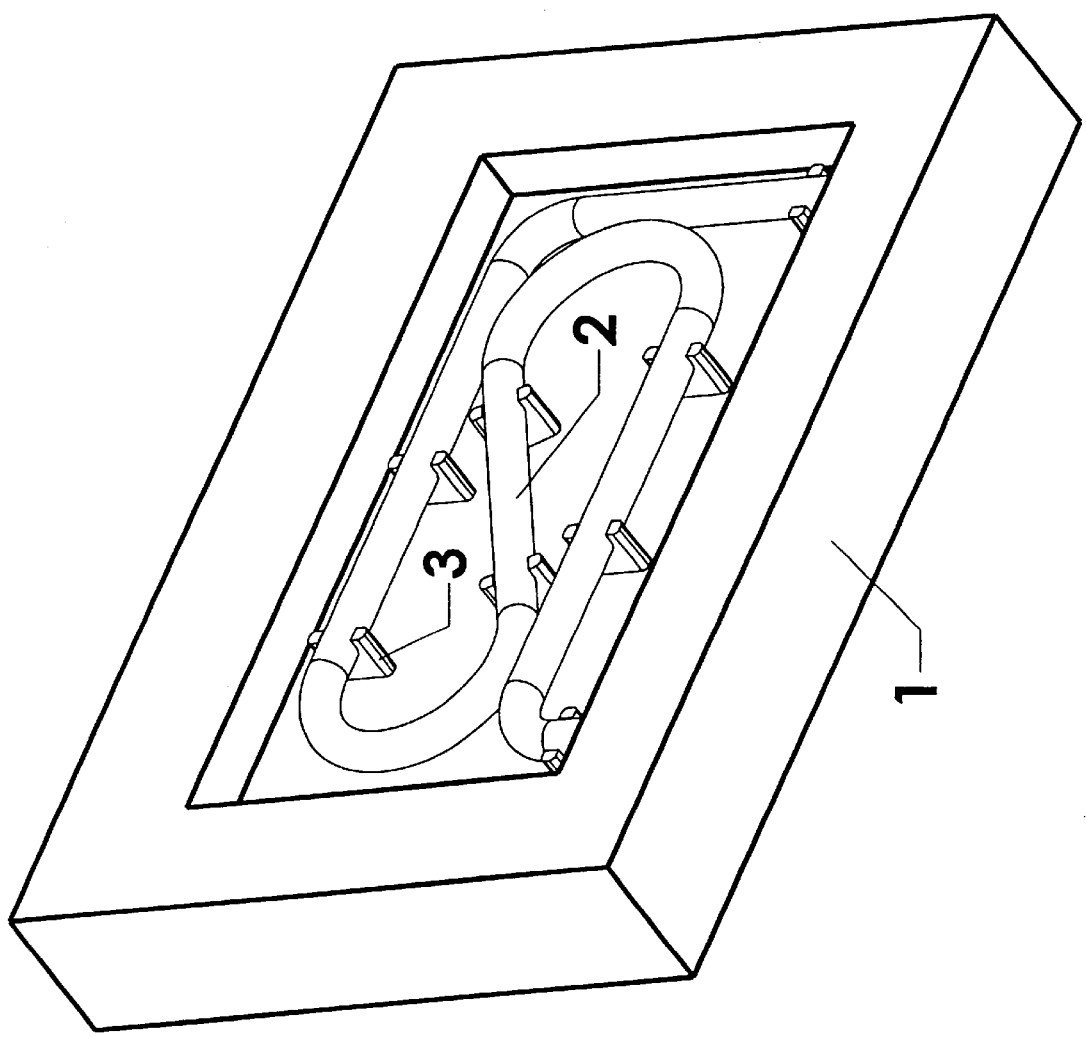
FIG. 1 is a top view of the bottom 1 of the preform reinforcement mold cavity containing a tube structure 2 mounted on "cradles" 3 located therein.
Figure 2:
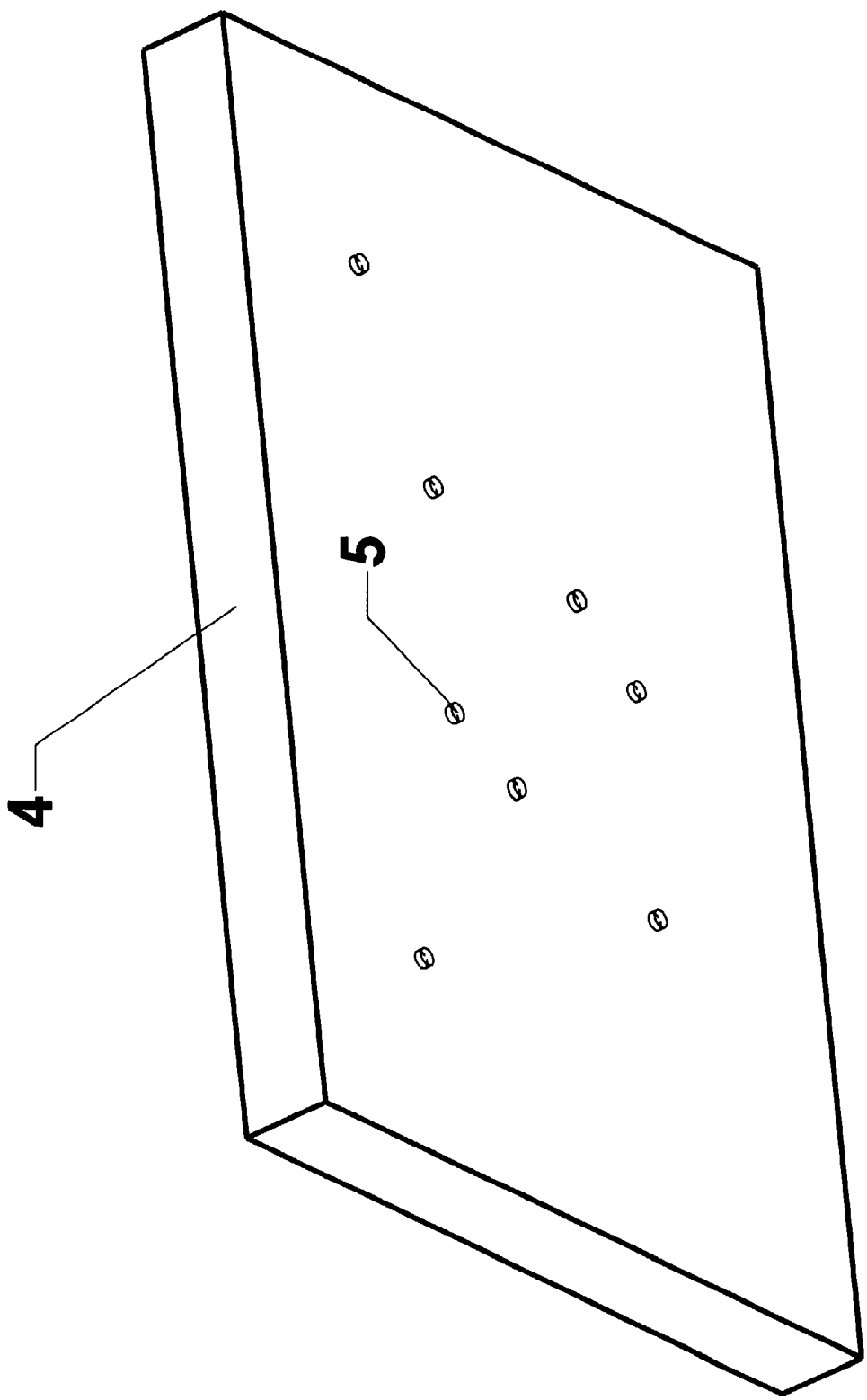
FIG. 2 is a bottom view of the top 4 of the preform reinforcement mold cavity illustrating "hold downs" 5 located therein.
Figure 3:
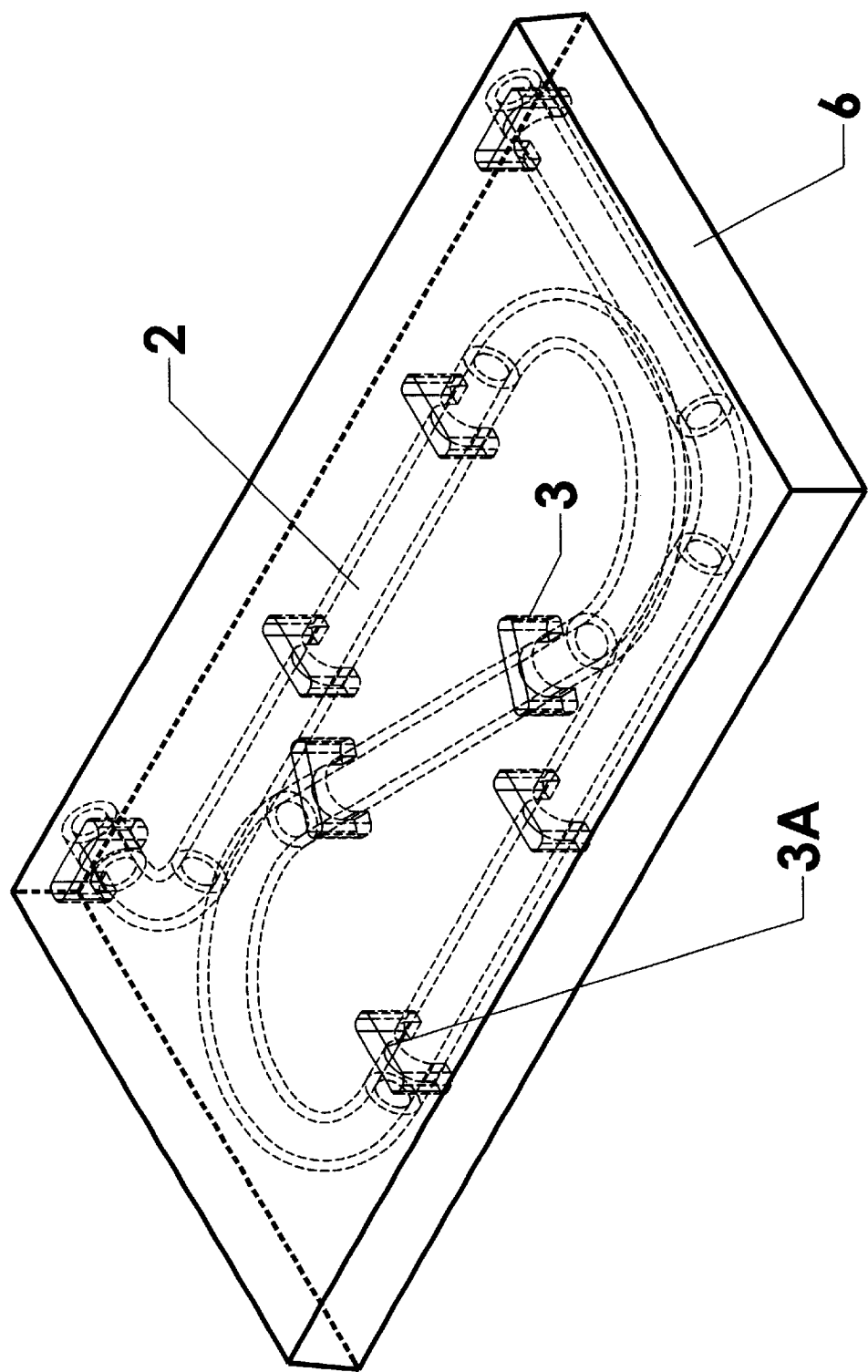
FIG. 3 is a top view of the bottom 6 of the infiltration mold cavity illustrating the preform reinforcement material with an insert contained therein.
Figure 4:
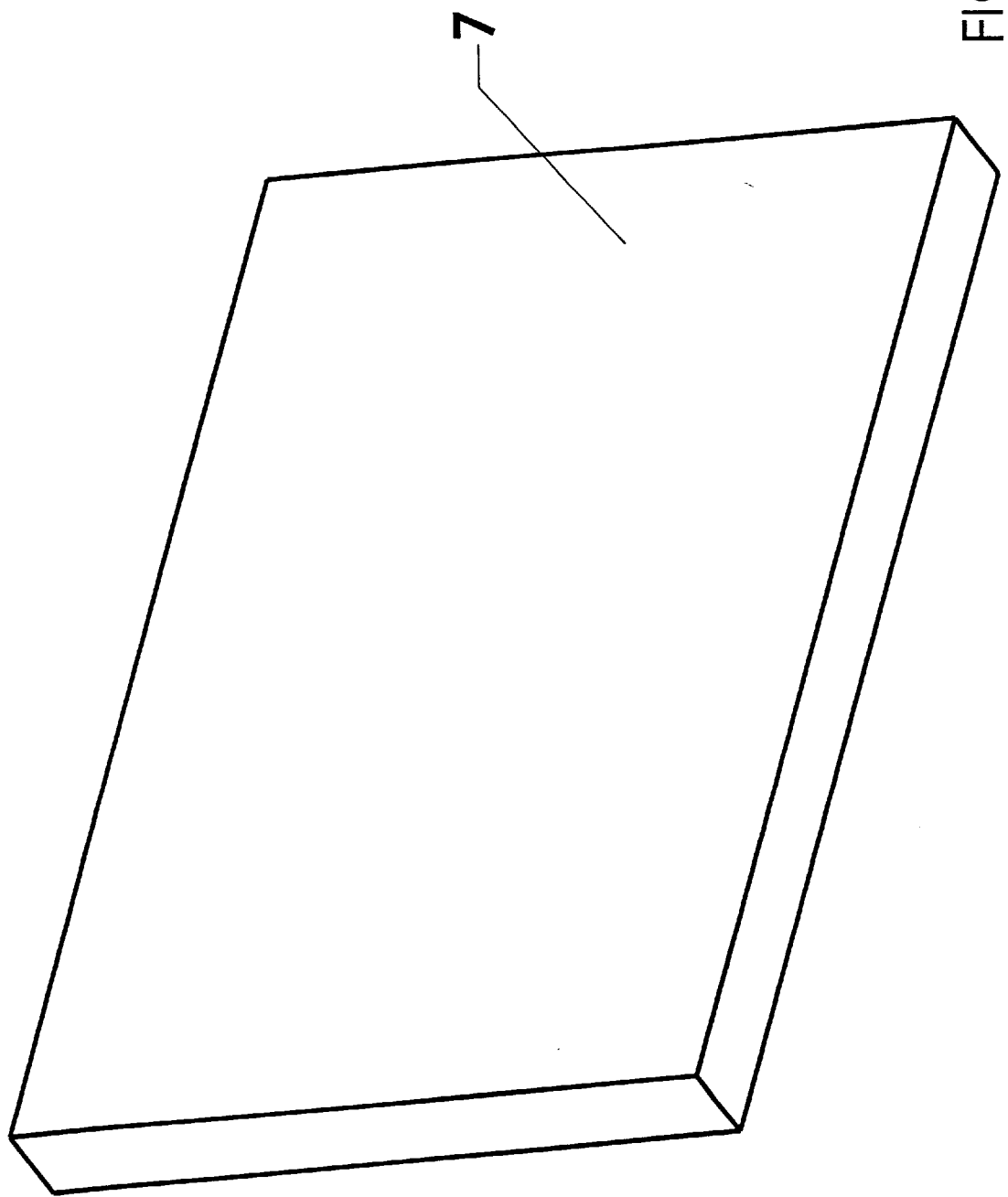
FIG. 4 is a top view of the top 7 of the infiltration mold cavity.

This invention is directed to a highly efficient thermal management system utilizing liquid flow through cooling channels cast in a metal matrix composite. Referring now to the drawings, and more particularly to FIG. 1, an insert 2 is positioned on the bottom 1 of preform reinforcement mold cavity, resting on cradles 3 integrally connected to bottom 1 of the interior of the mold cavity. The cradles 3 are raised to allow for no contact between the insert and the bottom 1 of the mold cavity. The inserts can be in the form of complex tube structures or a closed box structure containing baffles or pin fins integrated therein. The insert material can be made of stainless steel, refractory metals, or other metals coated such as not to dissolve or corrode when in contact with molten metal. Inserts made of graphite, titanium and ceramic can also be utilized. The insert is CTE compatible with the metal matrix composite and is preferably thermally conductive. The insert is sealed at its ends prior to being positioned in the reinforcement mold cavity 1 to prevent it from being filled with preform reinforcement material. This also prevents the insert from being filled with molten metal during the metal infiltration process. The reinforcement mold cavity 1 is typically prepared from a metal cavity with the dimensions defined to produce a preform structure containing the insert. FIG. 2 illustrates the top 4 of the mold cavity with hold-downs 5 integrally connected thereto and positioned over cradles 3. The hold-downs are raised to allow for no contact between the insert 2 and the top 4 of the mold cavity. When bottom 1 and top 4 of the mold cavity are joined together insert 2 is rigidly secured between cradles 3 below and hold-downs 5 above forming a closed cavity suitable for injection molding. Next, a preform reinforcement material such as Silicon Carbide (SiC) is injected into the closed mold. While SiC is the embodiment illustrated, other suitable reinforcement materials include Aluminum Nitride, $Al_2O_3$, Boron Nitride, Diamond, Molybdenum, tungsten and graphite powder. The preform reinforcement material is injection molded in a well-dispersed slurry consisting essentially of at least about 30 vol. % inorganic sinterable particulates, a non-aqueous liquid vehicle having a volume change on freezing of not greater than about +/−10%, and a dispersant. The process of forming the reinforcement material is described in U.S. Pat. No. 5,047,182, incorporated by reference. The preform comprises a microstructure designed to have a predetermined fraction of void volume or open structure that is to be subsequently filled with molten metal. The volume fraction of preform material is determined by its type and by the final CTE requirement of the finished metal matrix composite. For example, in the case of a SiC particulate preform infiltrated with molten aluminum, the volume fraction of SiC is in the range of 0.20 to 0.70 and is sufficient to obtain composite CTE values in the range of 6 to 13 or more ppm/degree Celsius when exposed to temperatures in the range of −50 to 150 degree celsius. In a structure having graphite fiber reinforcement, the volume fraction of 0.60 graphite fibers is sufficient enough to produce CTE values of less than 5 ppm/degree Celsius. The thermal conductivity of an aluminum matrix composite such as described above, will have a range of 160–200 Wm/K at room temperature. As the preform material is injected into the closed mold, the mold cavity is chilled to a mold temperature of less than the freezing temperature of the vehicle, as described in U.S. Pat. No. 5,047,182 incorporated by reference. The injected preform material comes into intimate contact with the surface of the insert thereby eliminating voids or gaps at the preform to insert interface. Subsequent to the preform material solidifying the material is demolded or removed from the closed mold. The preform containing the insert is next dried by the process of non-destructive evaporation/sublimination as described in U.S. Pat. No. 5,047,182 incorporated by reference. After drying, any crevices or openings created by the mold cavity cradles 3 or hold-downs 5 are backfilled with preform material. Next, the preform material containing the insert is placed into an infiltration mold cavity 6. FIG. 3 illustrates a tube insert 2, completely encased within a Silicon Carbide (SiC) preform reinforcement material, placed in the infiltration mold cavity 6. FIG. 3 further illustrates the crevices or openings 3A, which are backfilled with SiC reinforcement material. Infiltration mold cavity 6 and top 7 are joined together to form a closed mold cavity suitable for molten metal infiltration casting. The porous preform material surrounding the insert is next infiltrated with molten aluminum to form a dense hermetic metal matrix composite in the desired product shape geometry. While molten aluminum is the embodiment illustrated other suitable metals include aluminum alloys, copper, and magnesium. The liquid metal infiltration process is described in U.S. Pat. No. 3,547,180 incorporated by reference. After aluminum infiltration, the metal matrix composite containing the insert is demolded or removed from the closed mold. Next, the inserts are connected to the external environment by machining a hole at the inlet and outlet of the insert. Appropriate fittings are placed on the inlet and outlet to allow for a cooling liquid source connection.

It should be understood that the preceding is merely a detailed description of one embodiment of this invention and that numerous changes to the disclosed embodiment can be made in accordance with the disclosure herein without departing from the spirit or scope of the invention. Rather, the scope of the invention is to be determined only by the appended claims and their equivalents.

We claim:

1. A system for cooling high power, heat generating devices, comprising:
    a heat generating device having a specific coefficient of thermal expansion;
    a metal matrix composite having a coefficient of thermal expansion substantially equal to that of said heat generating device, said composite having a shape conforming to said heat generating device such that heat can be transferred therebetween, said composite comprising an insert, said insert completely encased within said metal matrix composite, said insert having an inlet and outlet connected to a liquid source, said insert confining the flow of said liquid within said metal matrix composite, said composite further comprising a reinforcement material, said reinforcement material in intimate contact with the surface of said insert.

2. A metal matrix composite liquid flow through cooler for cooling high power, heat generating devices, comprising:
    an insert, said insert having an inlet and outlet through which a cooling liquid flows;
    a metal-matrix composite containing said insert, said metal-matrix composite material having a coefficient of thermal expansion substantially equal to the coefficient of thermal expansion of the heat generating devices, said metal-matrix composite containing a reinforcement material, said reinforcement material in intimate contact with the surface of said insert.

3. A liquid flow through cooler as defined in claim 2, wherein the coefficient of thermal expansion of said metal-matrix composite is between about 4 to about 16 ppm/degree Celsius.

4. A liquid flow through cooler as defined in claim 2, wherein said metal matrix composite comprises aluminum silicon carbide.

5. A liquid flow through cooler as defined in claim 2, wherein said insert is a tube structure.

6. A liquid flow through cooler as defined in claim 2, wherein said insert is a closed box structure.

7. A liquid flow through cooler as defined in claim 6, wherein said closed box structure contains baffles integrated therein.

8. A liquid flow through cooler as defined in claim 6, wherein said closed box structure contains pin fins integrated therein.

9. A liquid flow through cooler as defined in claim 4 wherein the conductivity of said aluminum silicon carbide is between the ranges of about 160 to about 200 W/(mk) at room temperature.

* * * * *